(12) United States Patent
Wieczorek et al.

(10) Patent No.: US 6,268,257 B1
(45) Date of Patent: Jul. 31, 2001

(54) METHOD OF FORMING A TRANSISTOR HAVING A LOW-RESISTANCE GATE ELECTRODE

(75) Inventors: Karsten Wieczorek, Reichenberg-Boxdorf; Michael Raab, Radebeul; Rolf Stephan, Dresden, all of (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/557,714

(22) Filed: Apr. 25, 2000

(51) Int. Cl.$^7$ .................................................. H01L 21/336
(52) U.S. Cl. ........................ 438/305; 438/682; 438/684; 438/685; 438/303; 438/307
(58) Field of Search ................... 438/682, 684, 438/685, 301, 303, 305, 307

(56) References Cited

U.S. PATENT DOCUMENTS

| | | | |
|---|---|---|---|
| 4,897,368 | 1/1990 | Kobushi et al. | 437/200 |
| 5,034,348 | 7/1991 | Hartswick et al. | 437/200 |
| 5,447,875 | 9/1995 | Moslehi | 437/41 |
| 5,851,890 | * 12/1998 | Tsai et al. | 438/303 |
| 6,140,192 | * 10/2000 | Huang et al. | 438/305 |

OTHER PUBLICATIONS

Goto et al., "Optimization of Salicide Processes for sub 0.1–$\mu$m CMOS Devices," *1994 Symposium on VLSI Technology Digest of Technical Papers*, pp. 119–120, Apr. 1994.
Sohn et al., "High Thermal Stability and Low Junction Leakage Current of Ti Capped Co Salicide and its Feasibility for High Thermal Budget CMOS Devices," Mar. 1998.
Goto et al., "A New Leakage Mechanism of Co Salicide and Optimized Process Conditions," *IEEE Transactions on Electron Devices*, vol. 46, No. 1, p. 117, Jan. 1999.

* cited by examiner

*Primary Examiner*—Long Pham
(74) *Attorney, Agent, or Firm*—Williams, Morgan & Amerson, P.C.

(57) ABSTRACT

A method is disclosed in which a low-resistance portion of the gate electrode of a transistor is formed independently of the formation of low-resistance portions in the drain and source regions. Accordingly, the device features a thick low-resistance portion in the gate electrode, for example, a thick gate silicide for supporting low gate delays by minimizing the gate resistance, and a thin low-resistance portion in the drain and source in order to meet the requirements for shallow junction integration. Moreover, a transistor is disclosed having a low-resistance gate electrode portion, the composition of which is different from the low-resistance portion of the drain and source.

28 Claims, 3 Drawing Sheets

METHOD OF FORMING A TRANSISTOR HAVING A LOW-RESISTANCE GATE ELECTRODE

BACKGROUND OF THE INVENTION

1. Field of the Invention

The present invention relates to integrated circuit devices and the fabrication of such devices and, more particularly, to semiconductor devices having a gate electrode with improved electrical characteristics and a method of making same.

2. Description of the Related Art

In the field of semiconductor integrated circuit devices, design features, e.g., gate length, channel length, are being steadily decreased in order to achieve higher package densities and to improve device performance. The rapid advance of field effect transistor design has affected a large variety of activities in the field of electronics in which the transistors are operated in a binary switching mode. In particular, complex digital circuits, such as micro-processors and the like, demand fast-switching transistors. Accordingly, the distance between the drain region and the source region of a field effect transistor, commonly referred to as the channel length or gate length dimension, has been reduced to accelerate the formation of a conductive channel between a source and a drain electrode as soon as a switching gate voltage is applied and, moreover, to reduce the electrical resistance of the channel.

Thus, a transistor structure has been created where the longitudinal dimension of the transistor, commonly referred to as the width dimension, extends up to 20 µm, whereas the distance of the drain and source, i.e., the gate length, may be reduced down to 0.2 µm or less. As the gate length of the channel has been reduced to obtain the desired switching characteristic of the drain-source line, the length of the gate electrode is also reduced. Since the gate electrode is typically contacted at one end of its structure, the electrical charges have to be transported along the entire width of the gate electrode, i.e., up to 20 µm, to uniformly build up the transverse electric field that is necessary for forming the channel between the drain and source regions. Due to the small length of the gate electrode, which usually consists of polycrystalline silicon, the electrical resistance of the gate electrode is relatively high, and it may cause high RC-delay time constants. Hence, the transverse electrical field necessary for fully opening the channel is delayed, thereby further deteriorating the switching time of the transistor line. As a consequence, the rise and fall times of the electrical signals are increased and the operating frequency, i.e., the clock frequency, has to be selected so as to take into account the aforementioned signal performance.

In view of the foregoing, the switching times of field effect transistors are no longer only limited by the drain and source characteristics, i.e. dimension and resistance, but also significantly depend on the signal propagation along the gate electrode. However, the resistance of the gate electrode affects the propagation time of a signal along the gate width direction. To minimize the electrical resistance of the drain and source regions, as well as that of the gate electrode, a silicidation process is usually performed in which a portion of the aforementioned regions are transformed into a metal silicide region in order to lower the respective electrical resistances. The depth of the metal silicide regions on the surfaces of the drain region, source region and gate electrode is limited by the requirements for the integrity of shallow drain/source junctions. That is, the metal silicide regions can only be made a certain thickness without adversely impacting the source/drain regions.

With reference to FIGS. 1A–C, an illustrative example of forming a MOS transistor according to a typical prior art process will be described. It is to be noted that the drawings in this application are merely schematic depictions of the various stages in manufacturing the illustrative device under consideration. The skilled person will readily appreciate that the dimensions shown in the drawings are not true to scale, and that different portions or layers are not separated by sharp boundaries as portrayed in the drawings but may instead comprise continuous transitions. Furthermore, various process steps, as described below, may be performed differently depending on particular design requirements. Moreover, in this description, only the relevant steps and portions of the device necessary for the understanding of the present invention are considered.

FIG. 1A shows a schematic cross-section through an illustrative MOS transistor at a specific stage of a typical prior art manufacturing process. Within a silicon substrate 1, a plurality of shallow trench isolations 2 comprised of, for example, silicon dioxide, are formed. The trench isolations 2 define a transistor active region 3 in which a channel region, a drain region and a source region will be formed. Over the transistor active region 3, a gate electrode 4 is formed. The gate electrode 4 may be comprised of a variety of materials, such as polycrystalline silicon. A thin gate insulation layer 5 separates the gate electrode 4 and the transistor active region 3. The process steps involved in patterning the gate electrode 4 are of common knowledge to the skilled person, and usually include the deposition of anti-reflecting coating (ARC) and the employment of short exposure wavelengths, such as wavelengths in the DUV (deep ultraviolet) range, while performing the required photolithography steps. Since these procedures are commonly known, the description thereof will be omitted. Moreover, sidewall spacers 8, usually consisting of, for example, silicon dioxide or silicon nitride, may be formed adjacent the sidewalls of the gate electrode 4 for aiding the forming of drain and source regions 9.

Next, as shown in FIG. 1B, a metal layer 6 is deposited over the transistor shown in FIG. 1A. The metal layer 6 may consist of a refractory metal, such as titanium, cobalt, etc., and it is provided in order to feed a subsequent silicidation process which is initialized by a heat treatment such as rapid thermal annealing (RTA). After the heat treatment, the portion of the metal layer 6 which has not reacted with the exposed surfaces of the transistor active region 3 and the gate electrode 4 is removed.

FIG. 1C schematically shows the cross-section of the MOS transistor shown in FIGS. 1A and 1B after a further heat treatment, such as an RTA process, has been performed. Through this further heat treatment, the silicided portions of the drain and source regions 9, as well as of the gate electrode 4, are converted into a low-resistance phase, e.g., a metal silicide. Accordingly, metal silicide portions 7 are formed on the source and drain regions 9 and a metal silicide portion 10 is formed on the upper surface of the gate electrode 4. The depth of the metal silicide portion on the gate electrode 4 is limited by the depth of the drain and source regions 9. That is, using traditional silicidation processing, the thickness of the metal silicide portion 10 cannot be made too thick; otherwise, too much of the source/drain regions 9 will be consumed during the silicidation process. Accordingly, the major part of the gate electrode 4 is maintained as polycrystalline silicon having a relatively low conductivity. As previously discussed, such an arrangement will cause a delay in charge carrier transportation along the gate width, whereby the signal performance of the device deteriorates.

In view of the above-mentioned problems, a need exists for a transistor having an increased signal performance and for a method of fabricating such a device. The present invention is directed to a method of making a semiconductor device that solves, or at least reduces, some or all of the aforementioned problems.

SUMMARY OF THE INVENTION

The present invention is directed to a method of forming a transistor having a low resistance gate electrode. In one illustrative embodiment, the method comprises forming a gate insulation layer above a surface of a semiconducting substrate, forming a gate electrode above the gate insulation layer, and forming a cover layer above the gate electrode. The method further includes the steps of forming a protective layer on the sidewalls of the gate electrode and above the surface of the substrate, removing the cover layer, forming a first layer of a refractory metal above the gate electrode and the protective layer, and converting at least a portion of the refractory metal layer to a metal silicide region positioned above the gate electrode.

BRIEF DESCRIPTION OF THE DRAWINGS

The invention may be understood by reference to the following description taken in conjunction with the accompanying drawings, in which like reference numerals identify like elements, and in which.

Figure 1A:
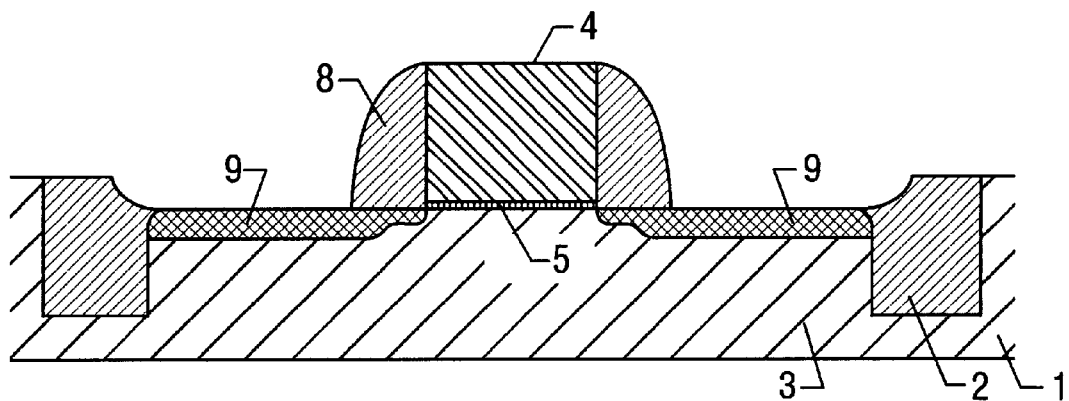
FIGS. 1A–1C are schematic cross-sectional views of various stages during the formation of a field effect transistor according to a typical prior art process.
Figure 1B:
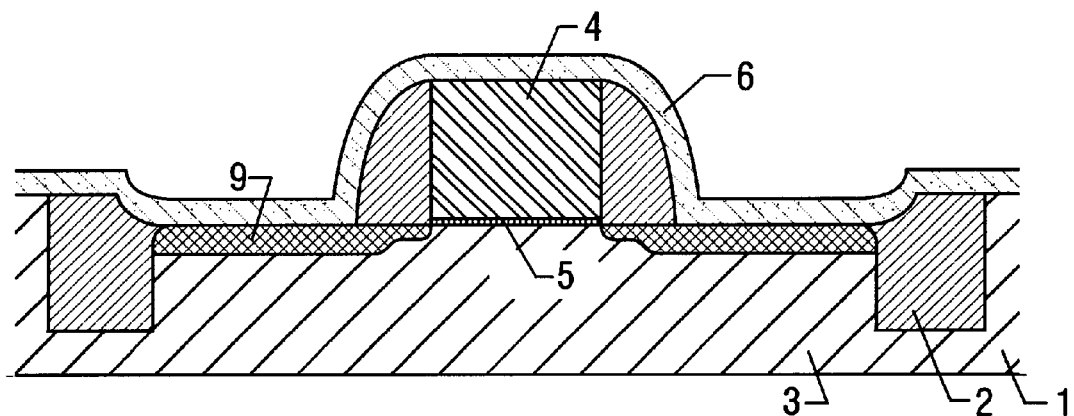
Figure 1C:
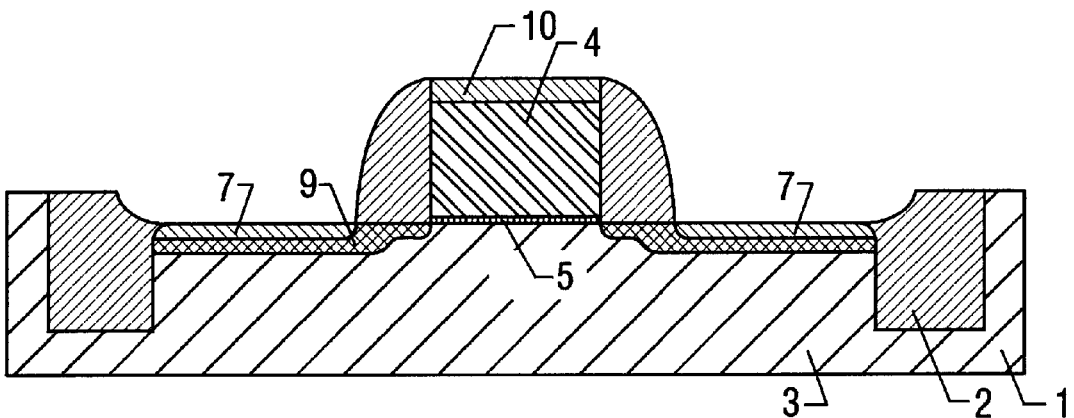

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2A–2F. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming a transistor with a low resistance gate electrode. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. Although the present invention is demonstrated with reference to a MOS transistor formed in a silicon substrate, the present invention may be applied to any kind of semiconductor in which a narrow gate structure is required. For example, the semiconductor substrate can be any appropriate material such as silicon, silicon germanium, etc.

Figure 2A:
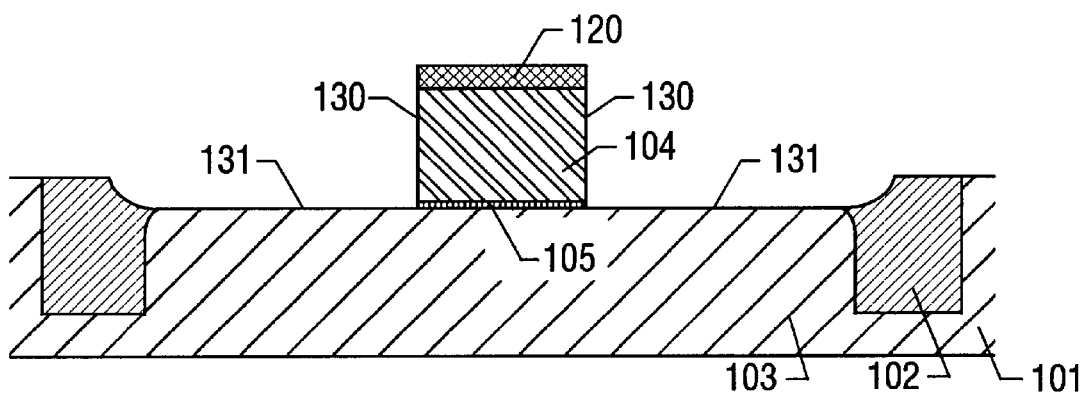
FIGS. 2A–2F are schematic cross-sectional views of various stages during the formation of a field effect transistor according to one illustrative embodiment of the present invention.

FIGS. 2A–2F show schematic cross-sectional views of various procedural steps in the course of forming a transistor in conformity with one illustrative embodiment of the present invention. In FIG. 2A, shallow trench isolations 102 comprised of, for example, silicon dioxide, are formed within a silicon substrate 101. The trench isolations 102 define a transistor active region 103 in the substrate 101. A gate insulation layer 105 and a gate electrode 104, having sidewalls 130, are formed over the active region 103 by forming layers of the appropriate material and patterning the layers using traditional photolithography and one or more etching processes.

As is common practice in the formation of cutting edge transistor gates, an anti-reflecting coating may be employed in the photolithography step to result in more accurate patterning. According to this embodiment, an anti-reflecting coating, such as silicon nitride, silicon oxynitride, etc., is formed above the layer comprising the gate electrode material prior to patterning operations. After the patterning is done, the portion of the anti-reflective coating acts as a cover layer 120 above the gate electrode 104.

The gate insulating layer 105 isolates the gate electrode 104 from the transistor active region 103. The gate electrode 104 may be formed from a variety of materials, and by a variety of techniques. For example, the gate electrode 104 may be comprised of polycrystalline silicon, and it may have a thickness ranging from approximately 1000–3000 Å. The gate electrode 104 may be formed by patterning a layer of material that is formed by a deposition process, such as an LPCVD or PECVD process. The gate insulation layer 105 may also be formed from a variety of materials, e.g., an oxide, an oxynitride, silicon dioxide, silicon oxynitride, or any other material sufficient to allow the gate insulation layer 105 to serve its intended purpose. The gate insulation layer 105 may be formed by a variety of techniques, such as thermal oxidation, deposition, etc.

Figure 2B:
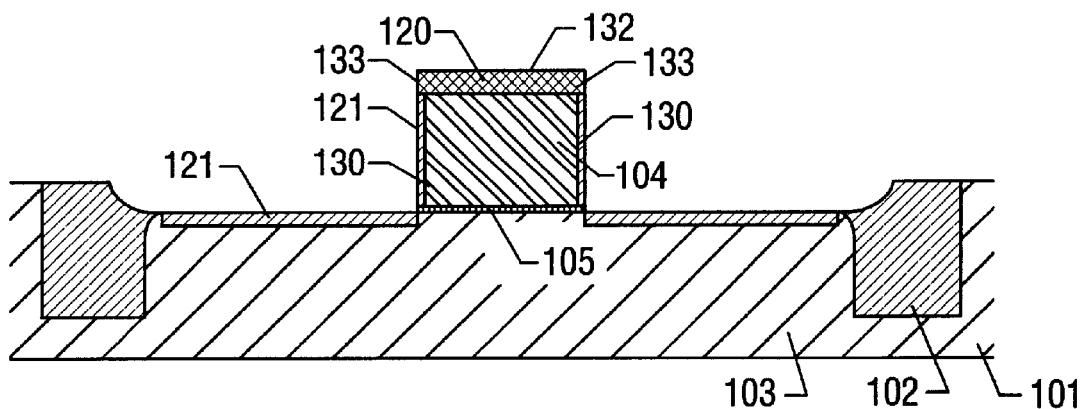

As shown in FIG. 2B, a thin protective layer 121 is subsequently formed on the sidewalls 130 of the gate electrode 104 and on the surface portions 131 of the transistor active region 103 not covered by the gate electrode 104. The protective layer 121 may be formed from any material that can be formed by oxidizing silicon or polysilicon, e.g., silicon dioxide, silicon oxynitride, etc. In one illustrative embodiment, the protective layer 121 is comprised of a thermally grown layer of silicon dioxide having a thickness ranging from approximately 30–300 Å.

In one illustrative embodiment, the cover layer 120 is comprised of a non-oxidizable material, such as silicon nitride, silicon rich nitride and silicon oxynitride. Consequently, the formation of the protective layer 121 on the top surface 132 or side surfaces 133 of the cover layer 120 is effectively prevented. In a subsequent step, the cover layer 120 may be removed by wet-chemical etching, wherein the thickness of the protection layer 121 is chosen so as to withstand the wet-chemical removal of the cover layer 120. The selective removal of cover layer 120 may be performed by using, for example, hot $H_3PO_4$. Subsequently, a surface cleaning process may be carried out, whereby the integrity of the protection layer 121 is maintained.

Figure 2C:
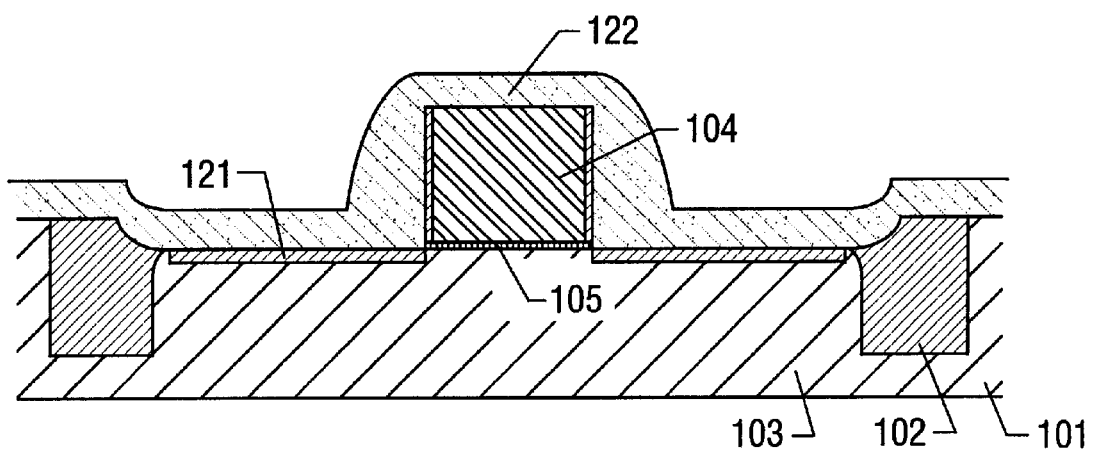

As shown in FIG. 2C, a metal layer 122 is formed over the gate electrode 104 and the active region 103. The metal layer 122 may be comprised of a variety of materials, such as cobalt, tungsten, titanium, molybdenum, copper, aluminum, nickel, tantalum, etc., and it may have a thickness ranging from approximately 100–1000 Å. The metal layer 122 may also be formed by a variety of processes, such as PVD, etc. In one illustrative embodiment, the metal layer 122 is comprised of approximately 200–500 Å of cobalt that is formed by an LPCVD process.

Figure 2D:
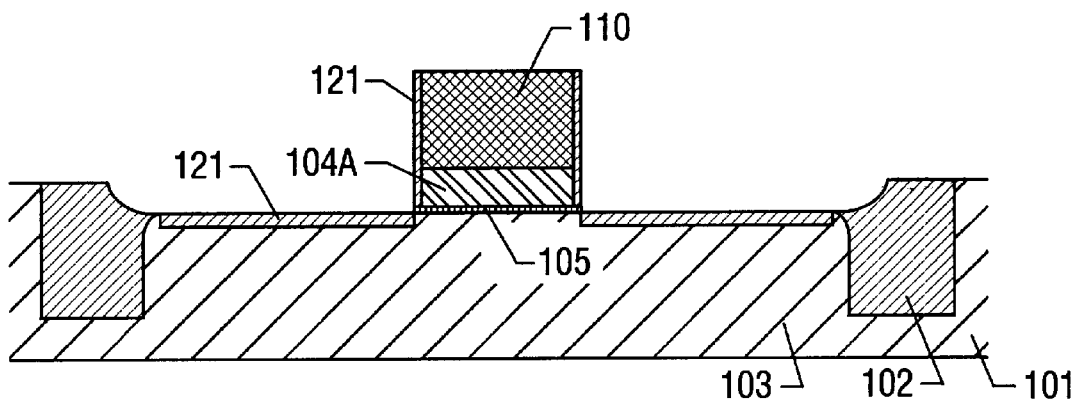

In FIG. 2D, the reference numeral 110 indicates a low-resistance, metal silicide portion of the gate electrode 104. The metal silicide portion 110 is formed using traditional silicidation techniques. For example, the metal silicide portion 110 may be formed by performing a first rapid thermal annealing process with a first, low temperature, so as to initialize the chemical reaction of the silicon in the gate electrode 104 and the metal in the metal layer 122 of FIG. 2C. The metal silicide region 110 has a depth dimension 134 that is adjustable by adjusting the thickness of the metal layer 122, which may have a thickness ranging from approximately 250–2500 Å depending upon the material selected for the metal layer 122. The thickness of the metal layer 122 is selected such that only a small portion 104A of the original gate electrode 104 is not transformed into a metal silicide, e.g., only approximately 50–500 Å of the gate electrode 104 may remain as polycrystalline silicon. The minimum thickness of the polycrystalline gate electrode 104A after silicidation will vary depending upon the device under construction and its operational parameters. In general, the residual thickness of the gate electrode 104A should have a minimum thickness ranging from approximately 50–200 Å.

In the case where the metal layer 122 is comprised of cobalt, a thickness of approximately one unit length consumes approximately 3.8 units of the thickness of the polycrystalline silicon. In one illustrative embodiment, a layer of cobalt having a thickness which is approximately 25 percent of that of the original polycrystalline silicon gate electrode 104 results in a metal silicide portion 110 having a sufficiently large depth, of approximately 950–2850 Å, while still preserving a thin polycrystalline silicon layer 104A having a thickness ranging from approximately 50–150 Å over the gate insulation layer 105. If a thinner metal silicide portion 110 comprised of cobalt silicide is desired, a thinner metal layer 122 should be formed. For metals other than cobalt, the corresponding ratios vary depending on the valence and the atomic radius of the metal. In choosing the appropriate thickness of the metal layer 122, these factors have to be considered. The residual portion 104A of the original polycrystalline silicon gate electrode 104 provides for the advantageous characteristics of the polycrystalline silicon-$SiO_2$ interface. For example, the interface allows further high temperature processing necessary to form the drain and source junctions, while avoiding diffusion of metal atoms into gate insulation layer 105, which may cause electrical breakdown in the final transistor.

During the first rapid annealing process, the transistor active region 103, as well as the sidewalls 130 of the gate electrode 104, are effectively prevented from being converted into a metal silicide by means of the protection layer 121 and the gate insulation layer 105. Preferably, a thin cap layer (not shown) of, for instance, approximately 100–500 Å of titanium nitride (TiN), is deposited over the metal layer 122 prior to the first annealing, so that the silicidation process is not dependent on the specific gas atmosphere during the reaction. After the first annealing process, excess metal which has not reacted with the silicon is removed by selective etching. Subsequently, a second rapid thermal annealing step is performed at a high temperature to convert the metal silicide into a low-resistance phase. The resulting significantly thick silicide layer just on top of the gate electrode 104 provides for a remarkably reduced overall resistance of the gate electrode 104, thereby reducing the signal delay time of the gate electrode.

Figure 2E:
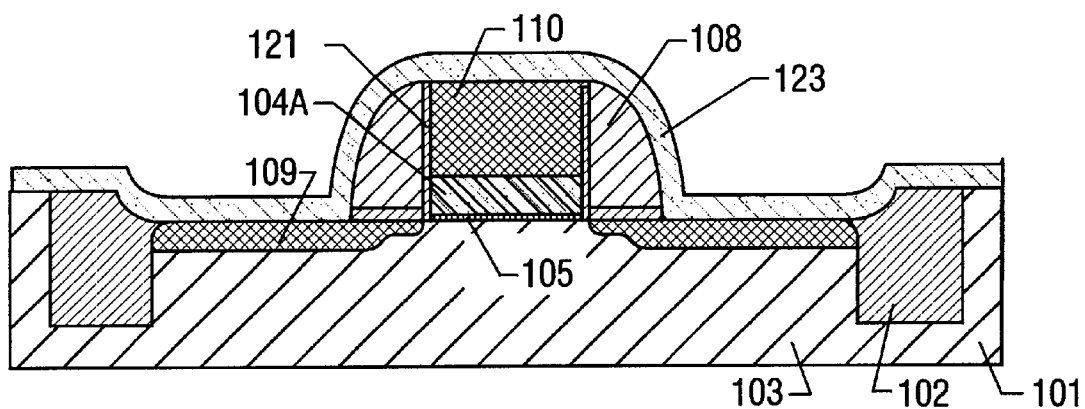

FIG. 2E shows the situation in which sidewall spacers 108 and drain and source regions 109 have been formed. Furthermore, the portion of protection layer 121, and any other insulating layer, covering the transistor active region 103 adjacent to the sidewall spacers 108 has also been removed. Subsequently, a second metal layer 123 comprised of a refractory metal is deposited to result in the structure depicted in FIG. 2E. The thickness of the metal layer 123 is selected so as to result in a desired penetration depth of the metal atoms into the source/drain region 9 of the device during the subsequent silicidation processing which follows. The second metal layer 123 may be comprised of materials such as the metals mentioned with respect to the metal layer 122. In particular, the metal selected for the second metal layer 123 may differ from that of the metal layer 122.

Figure 2F:
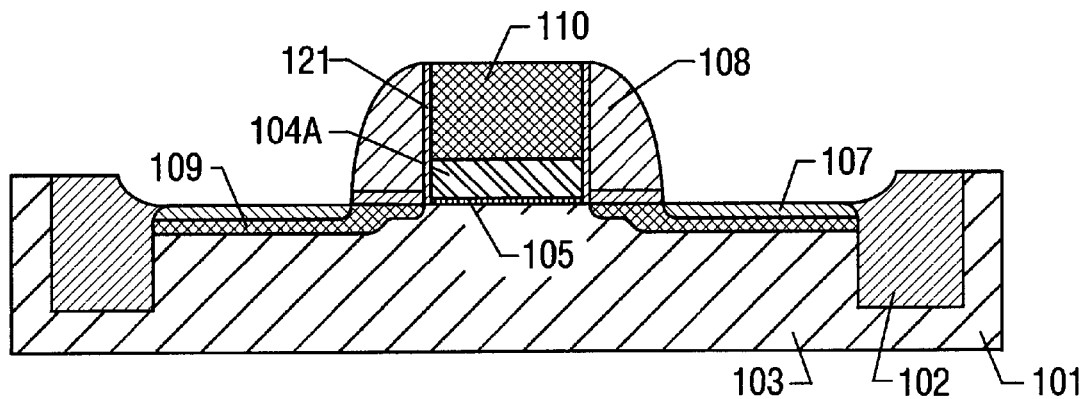

FIG. 2F shows the transistor structure after completion of a further silicide processing operation to convert a portion of the drain and source regions 109 into metal silicide regions 107. The final depth of the silicide regions 107 is controlled by means of the thickness of the metal layer 123 so as to meet the integrity requirements of the shallow drain and source junctions. In particular, the considerations previously mentioned regarding the thickness of metal layer 122 and the corresponding silicidation process analogously apply to the silicidation process using the metal layer 123. Moreover, the excess metal from the metal layer 123 may also be removed as has been previously discussed.

According to the present invention, the resulting transistor device features a thick, low-resistance, metal silicide portion 110 on top of the polycrystalline gate material, e.g., portion 104A. This results in a transistor with a lower gate resistance. Also note that the metal silicide contacts 107 on the drain-source region 109 are sufficiently thin in order to meet the requirements of shallow junction integrity, thereby supporting further device scaling for the benefit of increased signal performance.

The formation of the metal silicide portion 110 of the gate electrode 104 is thereby entirely decoupled from the formation of the drain and source regions 109. Accordingly, any appropriate metal for the low-resistance metal silicide portion 110, as well as for the low-resistance, metal silicide contacts 107 on the drain and source regions 109, may be selected. Preferably, the depth of the metal silicide portion 110 is adjusted so as to not extend along the entire depth of the gate electrode 104. This insures that there is an area in which the initial gate electrode material, for example, polycrystalline silicon, contacts the gate insulation layer 105 comprised of, for example, silicon dioxide ($SiO_2$), thereby maintaining process and device reliability with respect to the gate electrode insulating layer.

The present invention provides a method of forming a field-effect transistor in an integrated circuit, wherein a portion of the gate electrode 104 is transformed into a low-resistance metal silicide portion 110; thereby significantly lowering the overall electrical resistance of the gate electrode 104. In one illustrative embodiment, the method generally comprises the steps of: providing a semiconductor substrate having a surface, defining a transistor active region in the semiconductor substrate, forming a gate insulating layer on the transistor active region, depositing a gate electrode material on the gate insulating layer, patterning a gate electrode from the gate electrode material, forming a protection layer on sidewalls of the gate electrode and on a surface portion of the transistor active region which is not covered by the gate electrode, depositing over the gate electrode a metal layer having a predefined thickness, and initializing penetration of material of the metal layer into the gate electrode to lower an electrical resistance of a portion of the gate electrode, wherein a depth of said portion of the gate electrode is controlled by the predefined thickness.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a gate insulation layer above a surface of a semiconducting substrate;
   forming a gate electrode above said gate insulation layer, said gate electrode having sidewalls;
   forming a cover layer above said gate electrode;
   forming a protective layer on said sidewalls of said gate electrode and said surface of said substrate;
   removing said cover layer;
   forming a first layer of refractory metal above said gate electrode and said protective layer;
   converting at least a portion of said first layer of refractory metal above said gate electrode to a first metal silicide region positioned above said gate electrode;
   removing said protective layer from above said surface of said substrate;
   forming a second layer of refractory metal above said first metal silicide region above said gate electrode and a source/drain region formed in said substrate; and
   converting at least a portion of said second layer of refractory metal to a metal silicide region above said source/drain region.

2. The method of claim 1, wherein forming a gate insulation layer above a surface of a semiconducting substrate comprises forming a gate insulation layer comprised of at least one of silicon dioxide, silicon nitride, and silicon oxynitride above a surface of a semiconducting substrate.

3. The method of claim 1, wherein forming a gate insulation layer above a surface of a semiconducting substrate comprises forming a gate insulation layer by at least one of a thermal growth and deposition process above a surface of a semiconducting substrate.

4. The method of claim 1, wherein forming a gate electrode above said gate insulation layer, said gate electrode having sidewalls, comprises forming a gate electrode comprised of polycrystalline silicon above said gate insulation layer, said gate electrode having sidewalls.

5. The method of claim 1, wherein forming a gate electrode above said gate insulation layer, said gate electrode having sidewalls, comprises:
   depositing a layer comprised of a gate electrode material; and
   patterning said layer to define a gate electrode, said gate electrode having sidewalls.

6. The method of claim 1, wherein forming a cover layer above said gate insulation layer comprises forming a cover layer comprised of at least one of silicon nitride, silicon rich nitride and silicon oxynitride above said gate insulation layer.

7. The method of claim 1, wherein forming a cover layer above said gate electrode comprises depositing a cover layer above said gate electrode.

8. The method of claim 1, wherein forming a protective layer on said sidewalls of said gate electrode and said surface of said substrate comprises thermally growing a protective layer on said sidewalls of said gate electrode and said surface of said substrate.

9. The method of claim 1, wherein forming a protective layer on said sidewalls of said gate electrode and said surface of said substrate comprises forming a protective layer comprised of at least one of silicon dioxide, silicon oxynitride and silicon rich nitride on said sidewalls of said gate electrode and said surface of said substrate.

10. The method of claim 1, wherein removing said cover layer comprises removing said cover layer by performing an etching process.

11. The method of claim 1, wherein forming a first layer of refractory metal above said gate electrode and said protective layer comprises forming a first layer of refractory metal comprised of at least one of cobalt, titanium, tantalum, tungsten, molybdenum, zirconium, platinum and nickel above said gate electrode and said protective layer.

12. The method of claim 1, wherein forming a first layer of refractory metal above said gate electrode and said protective layer comprises depositing a first layer of refractory metal above said gate electrode and said protective layer.

13. The method of claim 1, wherein converting at least a portion of said first layer of refractory metal above said gate electrode to a first metal silicide region positioned above said gate electrode comprises performing at least two anneal processes to convert at least a portion of said first layer of refractory metal above said gate electrode to a first metal silicide region positioned above said gate electrode.

14. The method of claim 1, further comprising forming at least one sidewall spacer comprised of at least one of silicon dioxide and silicon nitride proximate each sidewall of said gate electrode.

15. The method of claim 1, wherein removing said protective layer from above said surface of said substrate comprises performing an etching process to remove said protective layer from above said surface of said substrate.

16. The method of claim 1, wherein forming a second layer of refractory metal above said first metal silicide region above said gate electrode and a source/drain region formed in said substrate comprises depositing a second layer of refractory metal above said first metal silicide region above said gate electrode and a source/drain region formed in said substrate.

17. The method of claim 1, wherein forming a second layer of refractory metal above said first metal silicide region above said gate electrode and a source/drain region formed in said substrate comprises forming a second layer of refractory metal comprised of at least one of cobalt, titanium, tantalum, tungsten, molybdenum, zirconium, platinum, and nickel above said first metal silicide region above said gate electrode and a source/drain region formed in said substrate.

18. The method of claim 1, wherein converting at least a portion of said second layer of refractory metal to a metal silicide region above said source/drain region comprises performing at least two anneal processes to convert at least a portion of said second layer of refractory metal to a metal silicide region above said source/drain region.

19. A method, comprising:

forming a gate insulation layer comprised of at least one of silicon dioxide, silicon nitride, and silicon oxynitride above a surface of a semiconducting substrate;

forming a gate electrode comprised of polysilicon above said gate insulation layer, said gate electrode having sidewalls;

depositing a cover layer comprised of at least one of silicon nitride, silicon rich nitride and silicon oxynitride and above said gate electrode;

growing a protective layer comprised of silicon dioxide on said sidewalls of said gate electrode and said surface of said substrate;

removing said cover layer; depositing a first layer of refractory metal above said gate electrode and said protective layer;

converting at least a portion of said first layer of refractory metal above said gate electrode to a first metal silicide region positioned above said gate electrode;

removing said protective layer from above said surface of said substrate;

depositing a second layer of refractory metal above said first metal silicide region above said gate electrode and a source/drain region formed in said substrate; and converting at least a portion of said second layer of refractory metal to a metal silicide region above said source/drain region.

20. The method of claim 19, wherein forming a gate insulation layer comprised of at least one of silicon dioxide, silicon nitride and silicon oxynitride above a surface of a semiconducting substrate comprises forming a gate insulation layer comprised of at least one of silicon dioxide, silicon nitride and silicon oxynitride by at least one of a thermal growth and deposition process above a surface of a semiconducting substrate.

21. The method of claim 19, wherein forming a gate electrode comprised of polysilicon above said gate insulation layer, said gate electrode having sidewalls, comprises:

depositing a layer comprised of polysilicon; and patterning said layer of polysilicon to define a gate electrode comprised of polysilicon, said gate electrode having sidewalls.

22. The method of claim 19, wherein removing said cover layer comprises removing said cover layer by performing an etching process.

23. The method of claim 19, wherein depositing a first layer of refractory metal above said gate electrode and said protective layer comprises depositing a first layer of refractory metal comprised of at least one of cobalt, titanium, tantalum, tungsten, molybdenum, zirconium, platinum and nickel above said gate electrode and said protective layer.

24. The method of claim 19, wherein converting at least a portion of said first layer of refractory metal above said gate electrode to a first metal silicide region positioned above said gate electrode comprises performing at least two anneal processes to convert at least a portion of said first layer of refractory metal above said gate electrode to a first metal silicide region positioned above said gate electrode.

25. The method of claim 19, further comprising forming at least one sidewall spacer comprised of at least one of silicon dioxide and silicon nitride proximate each sidewall of said gate electrode.

26. The method of claim 19, wherein removing said protective layer from above said surface of said substrate comprises performing an etching process to remove said protective layer from above said surface of said substrate.

27. The method of claim 19, wherein depositing a second layer of refractory metal above said first metal silicide region above said gate electrode and a source/drain region formed in said substrate comprises depositing a second layer of refractory metal comprised of at least one of cobalt, titanium, tantalum, tungsten, molybdenum, zirconium, platinum, and nickel above said first metal silicide region above said gate electrode and a source/drain region formed in said substrate.

28. The method of claim 19, wherein converting at least a portion of said second layer of refractory metal to a metal silicide region above said source/drain region comprises performing at least two anneal processes to convert at least a portion of said second layer of refractory metal to a metal silicide region above said surface of said substrate.

* * * * *